United States Patent
Fischer et al.

(10) Patent No.: US 6,768,139 B2
(45) Date of Patent: Jul. 27, 2004

(54) TRANSISTOR CONFIGURATION FOR A BANDGAP CIRCUIT

(75) Inventors: Helmut Fischer, Oberhaching (DE); Jürgen Lindolf, Friedberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/217,184

(22) Filed: Aug. 12, 2002

(65) Prior Publication Data

US 2003/0030128 A1 Feb. 13, 2003

(30) Foreign Application Priority Data

Aug. 10, 2001 (DE) .......................................... 101 39 515

(51) Int. Cl.[7] .......................................... H01L 31/072
(52) U.S. Cl. ........................ 257/185; 257/565; 327/539; 438/317
(58) Field of Search ................................ 257/565, 185, 257/E29.247, E29.252, E29.253, E29.332; 327/539; 438/317

(56) References Cited

U.S. PATENT DOCUMENTS

| | | | |
|---|---|---|---|
| 4,339,707 A | 7/1982 | Gorecki | 323/313 |
| 4,751,463 A | 6/1988 | Higgs et al. | 323/314 |
| 4,935,690 A | 6/1990 | Yan | 323/314 |
| 5,168,210 A | 12/1992 | Thus | 323/313 |
| 5,789,798 A | 8/1998 | Ono | 257/557 |
| 6,002,243 A | 12/1999 | Marshall | 323/313 |
| 6,252,269 B1 * | 6/2001 | Hasegawa et al. | 257/306 |

FOREIGN PATENT DOCUMENTS

| | | |
|---|---|---|
| DE | 35 37 578 A1 | 4/1986 |
| DE | 196 46 148 A1 | 4/1998 |
| EP | 0 132 240 A1 | 1/1985 |
| EP | 0 407 111 A2 | 1/1991 |
| EP | 0 476 571 A2 | 3/1992 |

OTHER PUBLICATIONS

H. Münzel et al.: "Vertical Bipolar Transistors on Buried Silicon Nitride Layers", *IEEE Electron Device Letters*, vol. EDL–5, 1984, pp. 283–285.

Anonymous: "Ring–Shaped Subcollector Reach–Through Contact For Vertical PNP Transistor", *IBM Technical Disclosure Bulletin*, vol. 32, No. 6A, Nov. 1989, pp. 41–42.

U. Tietze et al.: "Halbleiter–Schaltungstechnik" [semiconductor circuit technology], *Springer–Verlag*, Berlin, 9th ed., 1991, pp. 558–561.

* cited by examiner

Primary Examiner—Nathan J. Flynn
Assistant Examiner—Scott R. Wilson
(74) Attorney, Agent, or Firm—Laurence A. Greenberg; Werner H. Stemer; Gregory L. Mayback

(57) ABSTRACT

A transistor configuration for a bandgap circuit is configured in the form of an npn transistor. An insulated p-type well, which is surrounded by a buried n-type well, is used as a base terminal. The n-type well constitutes the emitter terminal. A negatively doped region, which acts as a collector terminal, is formed in the p-type well. The structure that is used exists in DRAM processes, and it can therefore be used to form an npn transistor as a footprint diode in bandgap circuits.

6 Claims, 2 Drawing Sheets

TRANSISTOR CONFIGURATION FOR A BANDGAP CIRCUIT

BACKGROUND OF THE INVENTION

Field of the Invention

The invention relates to a transistor configuration for bandgap circuits.

Bandgap circuits are used so that precise reference voltages can be provided. Precise reference voltages are needed in many fields of technology, for example, in analog evaluation circuits and in the field of digital circuits. The provision of a precise reference voltage is also required in the field of semiconductor memory components, for example, in DRAM memory components, so that a precise and fast functionality of the DRAM memory component can be guaranteed.

Bandgap circuits are described, for example, in Tietze and Schenk, 9th edition, Springer-Verlag, Ch. 18.4.2 (ISBN 3-540-19475-4). In bandgap circuits, the reference voltage is fixed, for example, by a series circuit of a resistor and a transistor. The resistor has a positive temperature coefficient. The temperature coefficient of the base-emitter voltage of the transistor, conversely, is negative. The resistor and the transistor are chosen in such a way that the temperature coefficients have the same magnitude, but different signs. For a fixed reference voltage, which is fixed by the material of the transistor, the temperature coefficient of the reference voltage is "0". The reference voltage is therefore independent of the temperature.

German Published, Non-Prosecuted Patent Application DE 4111 103 A1, corresponding to U.S. Pat. No. 5,229,710, discloses a CMOS bandgap reference circuit, with which a substantially temperature-independent reference voltage is generated. In this case, the bandgap circuit uses a parasitic bipolar transistor. An n-conductive well is provided in a positively conductive semiconductor substrate. The well contains more heavily doped zones with positive conductivity and more heavily doped zones with negative conductivity. Such a configuration gives rise to a parasitic vertical pnp bipolar transistor, whose p-type substrate acts as a collector. The n-type well with the heavily doped zones acts as a base and the heavily positively doped diffusion zone acts as an emitter. The construction of the bandgap reference circuit is made possible by parallel connection of two parasitic bipolar transistors and by the use of an operational amplifier and further resistors. The base-emitter voltage of the first parasitic transistor has a negative temperature coefficient. The difference between the base-emitter voltages between the first and the second parasitic transistors, conversely, has a positive temperature coefficient. The base-emitter voltage of the first transistor and the difference of the base-emitter voltages of the transistors are used as input signals for the operational amplifier. The negative and positive temperature coefficients are balanced through a suitable choice of the resistances, so that there is no dependency of the reference voltage on the temperature in a reference circuit, which corresponds to the bandgap of silicon.

SUMMARY OF THE INVENTION

It is accordingly an object of the invention to provide a transistor configuration for use in a bandgap circuit that overcomes the hereinafore-mentioned disadvantages of the heretofore-known devices of this general type and that has the advantage that a correspondingly configured structure with a first, second and third doped region, which is surrounded by a semiconductor substrate, is formed in semiconductor technology, especially for the production of DRAM memory components. The existing structure can be used according to the teachings of the invention to form a parasitic transistor for a bandgap circuit. It is therefore unnecessary to specially produce the embodiment known from the prior art, but rather the already existing structure can be used to produce the transistor.

With the foregoing and other objects in view, there is provided, in accordance with the invention, a transistor configuration for a bandgap circuit containing a substrate and a bipolar transistor formed in the substrate. The transistor has first, second and third doped regions, the first doped region embedded in the second doped region, the second doped region surrounded by the third region, the third region separating the second region from the substrate and surrounded by the substrate, and the first and third regions doped opposite to the second region and the substrate.

In accordance with another feature of the invention, the first and third regions are negatively doped and the second region and the substrate are positively doped. In this way, a structure that exists in many embodiments of semiconductor components can be used to form a transistor for a bandgap circuit.

In accordance with a further feature of the invention, the first region is heavily doped and the second and third regions are weakly doped in given zones. A transistor with good electrical properties is made possible by corresponding choice of the doping.

In accordance with a further feature of the invention, there is provided a fourth region more heavily doped than the third region, having the same polarity as the third region and introduced into the third region as a first terminal. A fifth region more heavily doped than the second region, having the same polarity as the second region and introduced into the second region as a second terminal is also provided. A heavily doped sixth region, having the same polarity as the first region and introduced into the first region as a third terminal is also included.

In accordance with a further feature of the invention, heavily doped regions are used to make contact with weakly doped regions. In this way, a smaller ohmic contact is produced between the electrical line and the weakly doped regions.

In accordance with a further feature of the invention, there is provided a resistor having first and second terminals. The transistor is connected in series with the second terminal of the resistor and is connected to ground as a diode circuit. A reference voltage is tapped from the first terminal of the resistor.

In accordance with a further feature of the invention, the series connection of the transistor with the resistor forms one of two current paths of a bandgap circuit. Another transistor and a second resistor form another of the two current paths; the other transistor is connected to ground.

In accordance with a further feature of the invention, the bandgap circuit has a further current path formed in parallel with the two current paths; the further current path has a further transistor configured according to the transistor and the further transistor is connected to ground.

In accordance with a further feature of the invention, the transistor according to the invention is connected in series with a resistor in a first current path. In this case, the transistor is connected to ground. The reference voltage, which is made temperature-compensated by the bandgap circuit, can be tapped from the input of the resistor. The chosen configuration provides a straightforward embodiment of the bandgap circuit.

In accordance with a further feature of the invention, further simplification of the bandgap circuit is achieved if a second current path is formed from a series circuit of a transistor and a resistor. The second current path is a part of a current mirror via which the current flowing on the second current path is also imposed in the first current path. Very precise tuning of the temperature coefficient is possible by virtue of the symmetrical construction of the two current paths.

Other features which are considered as characteristic for the invention are set forth in the appended claims.

Although the invention is illustrated and described herein as embodied in a transistor configuration for a bandgap circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
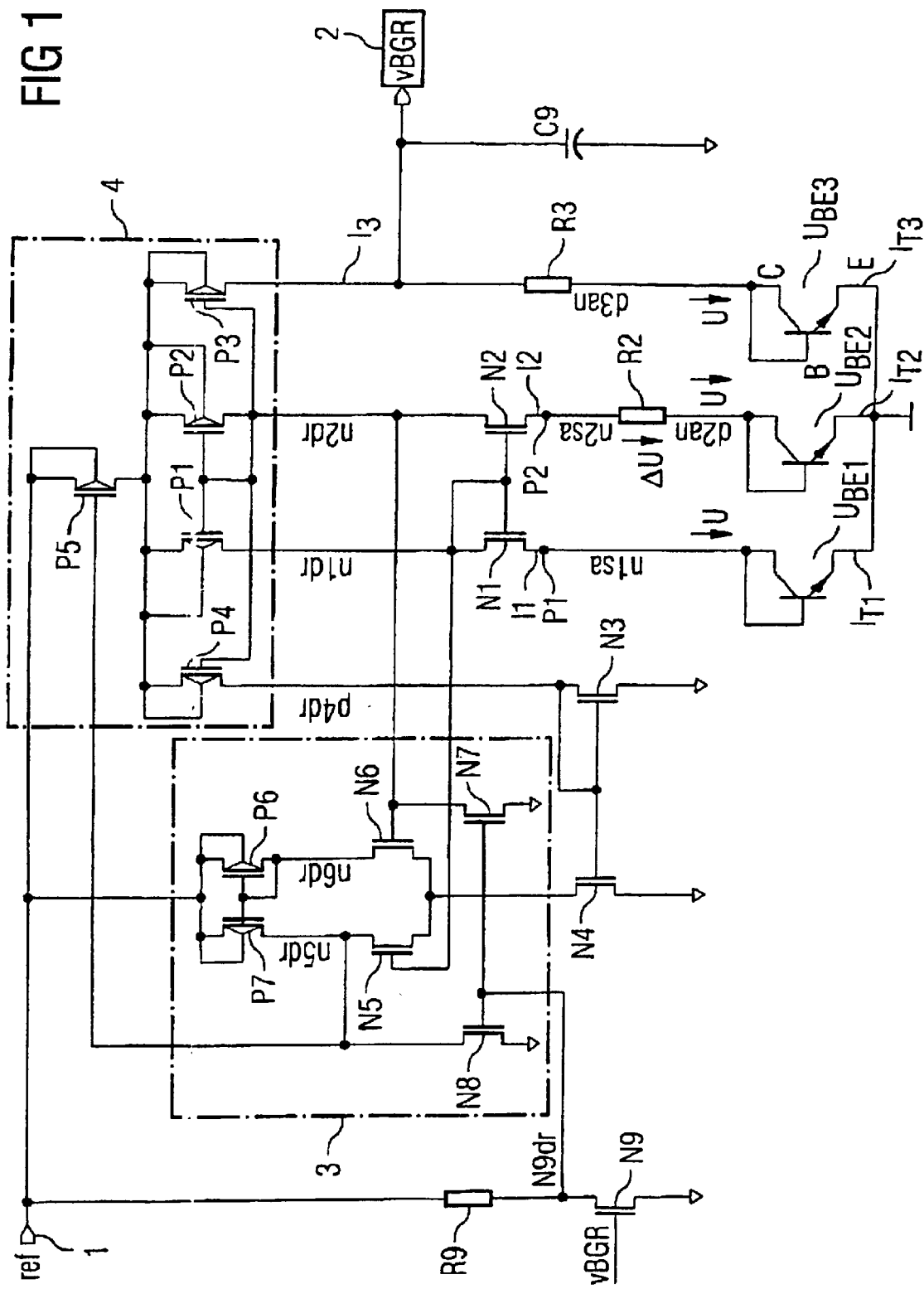
FIG. 1 is a schematic and block diagram of a bandgap circuit.

Referring now to the figures of the drawings in detail and first, particularly to FIG. 1 thereof, there is shown a bandgap circuit (and its parts), which is supplied with a supply voltage at a first terminal 1 and which provides, at a second terminal 2, a substantially thermally compensated output voltage that constitutes the reference voltage. The bandgap circuit contains a first, second and third current path I1, I2, I3. Further circuit parts, which are connected to the first, second and third current paths, are used to balance the voltage between the first and the second current paths, and they ensure that same strength of current flows through the first, second and third current paths I1, I2, I3. In order to balance the voltages at a first voltage point P1 of the first current path I1 and at a second voltage point P2 of the second current path I2, a voltage balancing circuit 3 is provided, which sets the voltages at the voltage points P1 and P2 to be equal.

Furthermore, a current control circuit 4 is provided, which sets currents in the first, second and third current paths I1, I2, I3 to be equal. The current control circuit 4 constitutes, together with the second current path I2, a current mirror by which the current flowing in the second current path is mirrored into the third current path I3. The third current path I3 is connected to the second terminal 2.

A third resistor R3 and a third transistor T3 are also connected in series in the third current path I3. The third transistor T3 is configured as an npn bipolar transistor. The collector of the third transistor T3 is joined to the base terminal of the third transistor T3, and it is linked to a second terminal of the third resistor R3. An emitter terminal of the third transistor T3 is connected to a ground potential.

The second current path I2 has a series circuit of a second resistor R2 and a second transistor T2. Preferably, the second transistor T2 is constructed identically to the third transistor T3, and is connected in the same way with the second resistor R2 and the ground potential.

The first current path I1 has a first transistor T1, which, like the third transistor T3, is configured as an npn transistor. The base terminal and the collector terminal of the first transistor T1 are electrically conductively connected to one another and are joined to the first current path I1. The emitter terminal of the first transistor T1 is linked to the ground potential.

The reference voltage UR, which is set up at the second terminal 2, is calculated according to the following formula:

$$UR = AI3 \cdot R3 + UBE3,$$

where AI3 denotes the current strength through the third current path I3 and UBE3 denotes the voltage drop between the base and the emitter of the third transistor T3. With the assumption that AI3=AI1=AI2, i.e., the currents through the first, second and third current paths I1, I2, I3 are equal, the following formula can be used for the current AI2, which denotes the current through the second current path I2:

$$AI2 = UT \cdot \ln(AT2/AT1)/R2,$$

where UT denotes the thermal voltage, AT2 denotes the area of the base-emitter contact of the second transistor T2, AT1 denotes the area of the base-emitter contact of the first transistor T1, and ln denotes the logarithm.

The differential voltage ΔU across the second resistor R2 is calculated according to the following formula:

$$\Delta U = UBE1 - UBE2 = UT \cdot \ln(AT2/AT1),$$

where UBE1 denotes the voltage drop between the base terminal and the emitter terminal of the first transistor T1, and UBE2 denotes the voltage drop between the base and the emitter terminals of the second transistor T2. UT denotes the bandgap voltage of the material from which the transistors are constructed.

On the basis of the available relationships, it is possible to calculate a reference voltage for which the reference voltage is independent of the temperature. These dependencies are sufficiently well known, and they will therefore not be dealt with further herein.

A special feature of the proposed circuit lies in the embodiment of the three current paths I1, I2, I3 and in the use of the particular embodiments of the first, second and third transistors T1, T2, T3. In the described exemplary embodiment of FIG. 1, the three transistors are represented as npn transistors. The invention is not, however, restricted to the use of npn transistors, but rather pnp transistors or a mixture of npn and pnp transistors may also be used.

An advantage of the invention is that the structures already existing in semiconductor components, especially DRAM memory components, can be used to form the transistors T1, T2, T3.

Figure 2:
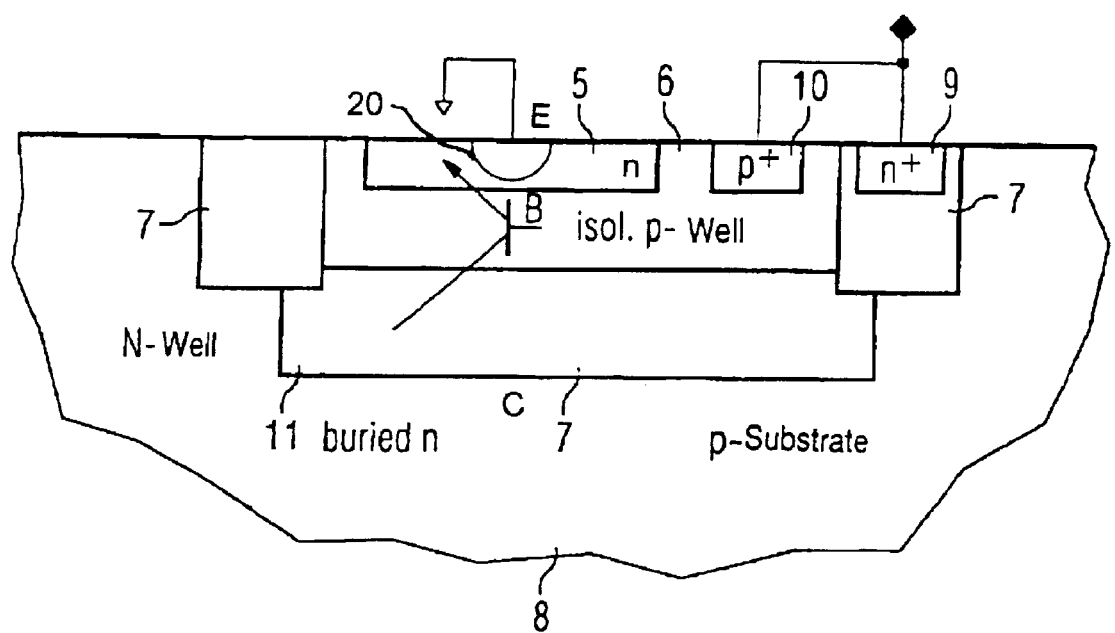
FIG. 2 is a fragmentary, diagrammatic, cross-sectional view of an npn transistor.

FIG. 2 shows an embodiment of a first, second or third transistor T1, T2, T3. The transistor is configured in the form of a parasitic bipolar transistor, which has a first region 5 that is embedded in a second region 6. The second region 6 is in turn embedded in a third region 7, which is in turn surrounded by a substrate 8. A fourth region 9, which has the same polarity, but heavier doping than the third region 7, is introduced into the third region 7.

A fifth region 10, which has the same polarity but heavier doping than the second region 6, is introduced into the second region 6. Preferably, the entire first region 5 is heavily doped.

A heavily doped sixth region 20, which has the same polarity as the first region 5, is introduced into the first region 5 as a third terminal.

In the described exemplary embodiment, the first region 5 is negatively doped, the second and fifth regions 6, 10 are positively doped and the third and fourth regions 7, 9 are negatively doped. The substrate 8, in which the third region 7 is embedded, is positively doped. In the representative embodiment, an electrical connection between the first, second and third current paths I1, I2, I3 is produced via the fourth and fifth regions 9, 10. A connection to ground is achieved via the first region 5. In this way, a parasitic bipolar transistor is produced between a buried plate 11 of the third region 7, the second region 6 and the first region 5. In this case, the buried plate 11 constitutes the collector terminal, the second region 6 constitutes the base terminal and the first region 5 constitutes the emitter terminal of the parasitic bipolar transistor.

Instead of the embodiment represented in FIG. 2, the first, the third and the fourth regions may also have positive doping, and the second and the fifth regions 6, 10 may have negative doping.

In the exemplary embodiment, the base terminal is formed by an insulated p-type well and the emitter terminal is formed by a buried n-type well. This structure exists in the DRAM process, and it can therefore advantageously be used. This structure also offers the advantage that, due to the formation of the p-type well as a base terminal, the bipolar transistor has a small base width and a smaller collector impedance. Consequently, the current gain is increased. Further, this reduces the band impedance of the bipolar transistor, connected as a diode, as shown in FIG. 1.

In this way, parasitic npn bipolar transistors are advantageously used as footprint diodes in bandgap circuits for the provision of a temperature compensated-reference voltage.

The transistors T1, T2, T3 are preferably formed in a semiconductor material, for example, silicon. It is, however, also possible to use other materials, which provide corresponding doping and electrical properties, so that a desired parasitic bipolar transistor is formed.

We claim:

1. A transistor configuration for a bandgap circuit comprising:

a substrate, a bipolar transistor formed in said substrate, said transistor having first, second and third doped regions;

said first doped region embedded in said second doped region;

said second doped region surrounded by said third region;

said third region separating said second region from said substrate and surrounded by said substrate;

said first and third regions doped opposite to said second region and said substrate, said first and third doped regions being negatively doped and said second region and said substrate being positively doped; and said third region containing a buried plate disposed below said second doped region, said bipolar transistor being formed by said first doped region functioning as an emitter terminal, said second doped region functioning as a base terminal, and said buried plate functioning as a collector terminal.

2. The transistor configuration according to claim 1, wherein said first region is heavily doped and said second and third regions are weakly doped in given zones.

3. The transistor configuration according to claim 1, which further comprises:

a fourth region more heavily doped than said third region, having the same polarity as said third region and introduced into said third region as a first terminal;

a fifth region more heavily doped than said second region, having the same polarity as said second region and introduced into said second region as a second terminal; and a heavily doped sixth region, having the same polarity as said first region and introduced into said first region as a third terminal.

4. The transistor configuration according to claim 1, which further comprises:

a resistor having first and second terminals;

said transistor connected in series with said second terminal of said resistor and connected to ground as a diode circuit; and a reference voltage tapped from said first terminal of said resistor.

5. The transistor configuration according to claim 4, wherein:

said series connection of said transistor with said resistor forms one of two current paths of a bandgap circuit; and another transistor and a second resistor form another of the two current paths, and said another transistor is connected to ground.

6. The transistor configuration according to claim 5, wherein:

the bandgap circuit has a further current path formed in parallel with the two current paths; and the further current path has a further transistor configured according to said transistor, and the further transistor is connected to ground.

* * * * *